United States Patent
Goergen

(10) Patent No.: US 11,910,568 B2
(45) Date of Patent: Feb. 20, 2024

(54) HEAT DISSIPATION SYSTEM WITH MICROELECTROMECHANICAL SYSTEM (MEMS) FOR COOLING ELECTRONIC OR PHOTONIC COMPONENTS

(71) Applicant: CISCO TECHNOLOGY, INC., San Jose, CA (US)

(72) Inventor: Joel Richard Goergen, Soulsbyville, CA (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 430 days.

(21) Appl. No.: 17/083,152

(22) Filed: Oct. 28, 2020

(65) Prior Publication Data

US 2021/0329810 A1 Oct. 21, 2021

Related U.S. Application Data

(60) Provisional application No. 63/012,830, filed on Apr. 20, 2020.

(51) Int. Cl.
- H05K 7/20 (2006.01)
- H01L 23/427 (2006.01)
- G02B 6/12 (2006.01)
- B81B 7/00 (2006.01)

(52) U.S. Cl.
CPC ............. *H05K 7/2039* (2013.01); *G02B 6/12* (2013.01); *H01L 23/427* (2013.01); *B81B 7/008* (2013.01); *B81B 2201/058* (2013.01); *B81B 2203/0127* (2013.01); *B81B 2207/012* (2013.01)

(58) Field of Classification Search
CPC .......... H05K 7/2039; G02B 6/12; B81B 7/08; B81B 2207/012; B81B 2201/058; B81B 2203/0127; B81B 7/008; H01L 23/427
See application file for complete search history.

(56) References Cited

U.S. PATENT DOCUMENTS 5,705,018 A * 1/1998 Hartley .................. F04B 43/14
 216/2
5,836,750 A * 11/1998 Cabuz ..................... F04B 43/14
 417/322

(Continued)

FOREIGN PATENT DOCUMENTS

| CN | 107164647 A | * | 9/2017 | ............. B22F 5/00 |
| CN | 207925520 U | * | 9/2018 | |
| WO | WO2004077629 A1 | | 9/2004 | |

OTHER PUBLICATIONS

Hanafi et al., Polycrystalline diamond photonic waveguides realized by femtosecond laser lithography, Opt. Mater. Express 9, 3109-3114 (2019) (Year: 2019).*

(Continued)

*Primary Examiner* — Peter Radkowski

(57) ABSTRACT

In one or more embodiments, an apparatus includes a substrate and die package, a thermal transfer plate positioned adjacent to the substrate and die package for cooling the substrate and die package, wherein at least one electrical path extends through the thermal transfer plate for transmitting power from a power module to the substrate and die package, and a microelectromechanical system (MEMS) module comprising a plurality of air movement cells for dissipating heat from the thermal transfer plate.

28 Claims, 12 Drawing Sheets

(56) References Cited

U.S. PATENT DOCUMENTS

| | | | |
|---|---|---|---|
| 6,106,245 A * | 8/2000 | Cabuz | F04B 43/0063 |
| | | | 417/322 |
| 6,550,531 B1 | 4/2003 | Searles | |
| 6,629,425 B2 * | 10/2003 | Vaiyapuri | F04B 43/12 |
| | | | 361/689 |
| 7,084,004 B2 * | 8/2006 | Vaiyapuri | H01L 23/473 |
| | | | 438/106 |
| 7,107,777 B2 * | 9/2006 | Vaiyapuri | F04B 43/14 |
| | | | 361/689 |
| 7,548,421 B2 * | 6/2009 | Malone | H05K 7/20145 |
| | | | 361/695 |
| 7,823,403 B2 * | 11/2010 | Sapir | F04B 19/006 |
| | | | 165/80.4 |
| 7,841,843 B2 * | 11/2010 | Cho | H01L 23/467 |
| | | | 417/413.1 |
| 7,972,178 B2 | 7/2011 | Chan | |
| 8,167,470 B2 * | 5/2012 | Krattiger | G02B 23/2469 |
| | | | 362/556 |
| 8,376,031 B2 * | 2/2013 | Yang | H01L 23/467 |
| | | | 165/104.34 |
| 8,506,105 B2 * | 8/2013 | Sharma | F21V 3/02 |
| | | | 362/373 |
| 9,337,121 B2 * | 5/2016 | Jun | H01L 21/32051 |
| 9,839,166 B2 * | 12/2017 | Kim | G02B 27/0006 |
| 10,018,194 B2 * | 7/2018 | Harvey | F04B 49/225 |
| 10,020,201 B2 * | 7/2018 | Jun | H01L 23/467 |
| 10,054,745 B2 * | 8/2018 | Webster | G02B 6/1228 |
| 10,153,261 B2 * | 12/2018 | Dogruoz | H01L 23/3675 |
| 10,371,135 B2 * | 8/2019 | Fouillet | F04B 19/06 |
| 10,485,091 B2 * | 11/2019 | Molla | H01L 23/3735 |
| 10,509,174 B2 * | 12/2019 | Webster | G02B 6/1228 |
| 10,573,608 B2 | 2/2020 | Dogiamis | |
| 10,674,241 B2 | 6/2020 | Rivaud | |
| 11,156,783 B2 * | 10/2021 | Webster | G02B 6/30 |
| 2002/0184907 A1 * | 12/2002 | Vaiyapuri | H01L 23/473 |
| | | | 361/689 |
| 2004/0031281 A1 * | 2/2004 | Vaiyapuri | H01L 23/473 |
| | | | 257/E23.099 |
| 2004/0031594 A1 * | 2/2004 | Vaiyapuri | F04B 43/14 |
| | | | 257/E23.099 |
| 2005/0074662 A1 * | 4/2005 | Cho | G06F 1/20 |
| | | | 429/444 |
| 2006/0189022 A1 * | 8/2006 | Vaiyapuri | F04B 43/12 |
| | | | 257/E23.099 |
| 2006/0236710 A1 * | 10/2006 | Vaiyapuri | H01L 23/467 |
| | | | 257/E23.098 |
| 2006/0236711 A1 * | 10/2006 | Vaiyapuri | H01L 23/467 |
| | | | 257/E23.098 |
| 2007/0048154 A1 * | 3/2007 | Sapir | F04B 19/006 |
| | | | 417/413.2 |
| 2007/0091565 A1 * | 4/2007 | Malone | H05K 7/20145 |
| | | | 257/E23.099 |
| 2009/0154192 A1 * | 6/2009 | Krattiger | G02B 23/2469 |
| | | | 362/574 |
| 2009/0288807 A1 * | 11/2009 | Yang | F28F 3/02 |
| | | | 29/890.03 |
| 2010/0018675 A1 * | 1/2010 | Aarts | H01L 23/467 |
| | | | 165/104.19 |
| 2012/0051058 A1 * | 3/2012 | Sharma | F21V 29/505 |
| | | | 362/294 |
| 2012/0202373 A1 * | 8/2012 | Klinghult | F04B 43/046 |
| | | | 439/485 |
| 2013/0003303 A1 | 1/2013 | Lindgren | |
| 2014/0044568 A1 * | 2/2014 | Fouillet | F04B 43/046 |
| | | | 417/474 |
| 2015/0194363 A1 * | 7/2015 | Jun | H01L 23/367 |
| | | | 257/714 |
| 2015/0260181 A1 * | 9/2015 | Harvey | F04B 45/043 |
| | | | 417/472 |
| 2015/0342093 A1 * | 11/2015 | Poltorak | H05K 7/20509 |
| | | | 165/185 |
| 2015/0368535 A1 * | 12/2015 | Dardona | H01L 23/3736 |
| | | | 428/408 |
| 2016/0141831 A1 | 5/2016 | Li | |
| 2016/0148902 A1 | 5/2016 | Chen | |
| 2016/0225631 A1 * | 8/2016 | Jun | H01L 21/3065 |
| 2016/0255748 A1 * | 9/2016 | Kim | G02B 27/017 |
| | | | 361/695 |
| 2016/0343637 A1 * | 11/2016 | Axelrod | B81B 7/0093 |
| 2017/0192174 A1 * | 7/2017 | Webster | G02B 6/12 |
| 2018/0286844 A1 * | 10/2018 | Dogruoz | H01L 23/3675 |
| 2018/0341064 A1 * | 11/2018 | Webster | G02B 6/122 |
| 2019/0098743 A1 * | 3/2019 | Molla | H01L 23/3735 |
| 2019/0122951 A1 * | 4/2019 | Chen | H01L 23/5226 |
| 2020/0088946 A1 * | 3/2020 | Webster | G02B 6/122 |

OTHER PUBLICATIONS

Horng et al., Effect of diamond like carbon layer on heat dissipation and optoelectronic performance of vertical-type InGaN light emitting diodes. Appl. Phys. Lett. Oct. 22, 2012; 101 (17): 171102. https://doi.org/10.1063/1.4764007 (Year: 2012).*

* cited by examiner

HEAT DISSIPATION SYSTEM WITH MICROELECTROMECHANICAL SYSTEM (MEMS) FOR COOLING ELECTRONIC OR PHOTONIC COMPONENTS

STATEMENT OF RELATED APPLICATIONS

The present application claims priority from U.S. Provisional Application No. 63/012,830 entitled HEAT DISSIPATION FOR IN PACKAGE OPTICS, filed on Apr. 20, 2020, the contents of which are incorporated herein in its entirety.

TECHNICAL FIELD

The present disclosure relates generally to heat dissipation for electronic and photonic components, and more particularly, to heat dissipation with a microelectromechanical system (MEMS).

BACKGROUND

Higher performance and power distribution with increased density of electronic and photonic components have led to an increase in operating temperature. The increased operating temperature may result in damage or instability to integrated circuits if heat is not sufficiently dissipated. Along with thermal challenges, additional difficulties arise in delivering power to electronic components and optical signals to photonic components if the integrated circuits are packaged with a cooling system.

BRIEF DESCRIPTION OF THE DRAWINGS

Corresponding reference characters indicate corresponding parts throughout the several views of the drawings.

DESCRIPTION OF EXAMPLE EMBODIMENTS

Overview

Figure 1:
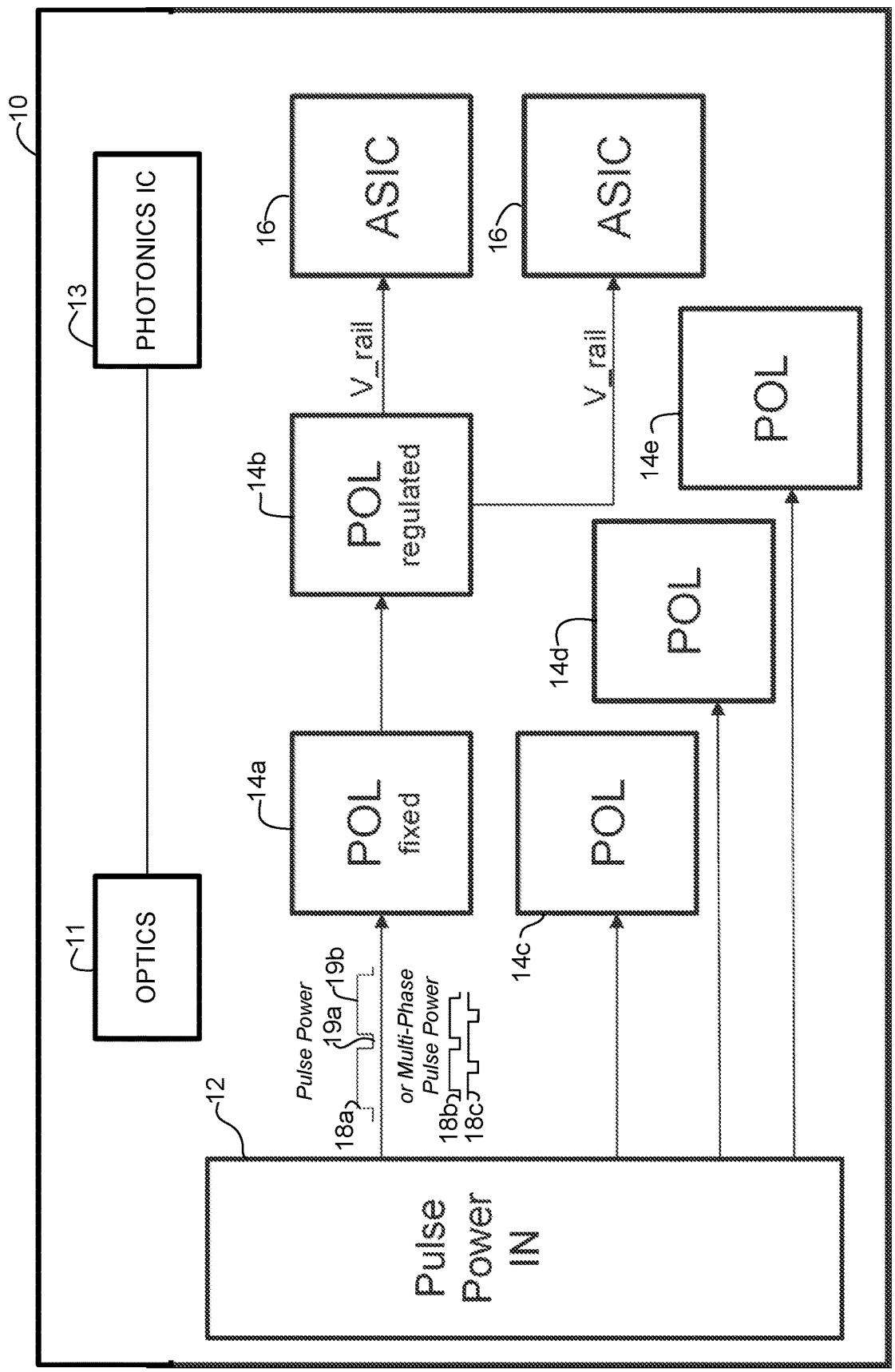
FIG. 1 is a block diagram illustrating an example of power distribution through Point-of-Load (POL) modules and transmission of optical signals.

In one embodiment, an apparatus generally comprises a substrate and die package, a thermal transfer plate positioned adjacent to the substrate and die package for cooling the substrate and die package, wherein at least one electrical path extends through the thermal transfer plate for transmitting power from a power module to the substrate and die package, and a microelectromechanical system (MEMS) module comprising a plurality of air movement cells for dissipating heat from the thermal transfer plate.

In another embodiment, an apparatus generally comprises a substrate and die package comprising at least one electronic integrated circuit and at least one photonic integrated circuit, and a heat dissipation system for dissipating heat from the substrate and die package. The heat dissipation system comprises a vapor chamber, heat sink fins coupled to the vapor chamber and a MEMS module comprising a plurality of air movement cells operable to push air over the heat sink fins. The heat dissipation system comprises at least one electrical path for transmitting power or an electrical signal to the electronic integrated circuit and at least one optical path for transmitting an optical signal to the photonic integrated circuit.

In yet another embodiment, an apparatus generally comprises a thermal transfer plate configured for dissipating heat from an electronic component or a photonic component, a heat transfer element coupled to the thermal transfer plate, and a MEMS module comprising a plurality of air movement cells operable to push air over the heat transfer element. The thermal transfer plate comprises at least one path for transmitting power to the electronic component or an optical signal to the photonic component.

Further understanding of the features and advantages of the embodiments described herein may be realized by reference to the remaining portions of the specification and the attached drawings.

Example Embodiments

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

A power distribution system may be configured to deliver power from a point-of-load (POL) to an ASIC (Application-Specific Integrated Circuit) or other electronic integrated circuit. As power requirements increase, additional thermal considerations may be needed. In-package optic applications may present additional challenges including integration of optics and delivery of optical signals without impacting cooling systems.

One or more embodiments described herein provide integration of power and optics for delivery through a heat dissipation system for cooling electronic and photonic integrated circuits (ICs) (die, ASIC, chip, in-package optics). One or more electrical paths and optical paths are formed in the heat dissipation system to allow power to pass from the POL to electronic components coupled to the substrate and optical signals to pass through the heat dissipation system (or heat dissipation system and substrate) to photonic elements. As described in detail below, the heat dissipation system comprises a thermal transfer plate comprising a vapor chamber (one or more vapor chambers, one or more heat pipes), and one or more MicroElectroMechanical System (MEMS) modules. In one or more embodiments, the heat dissipation system may also include heat sink fins coupled to one or more heat transfer elements (heat pipes, copper tubes) extending laterally from one or more sides of the thermal transfer plate to further dissipate heat, as described below.

One or more MEMS modules may be used to push air upwards or downwards over the heat transfer elements and fins. In one or more embodiments, power modulation may be used to power the MEMS modules. Conventional air cooling (e.g., one or more fans) may be coupled with the heat dissipation system to cool higher power ASICs (Application-Specific Integrated Circuit) or other integrated circuit (e.g., over 750 watts).

As described in detail below, the thermal transfer plate may comprise, for example, a power delivery block (e.g., PCB (Printed Circuit Board)) with one or more power vias for transferring power through the thermal transfer plate and one or more openings for defining an optical path. The power vias may be used to connect POLs to the substrate from a top or bottom direction (from one or both sides of the substrate). The optical path may comprise one or more optical elements (e.g., waveguide, mirror, or other optics) for transmitting an optical signal through the thermal transfer plate and directing the optical signal to or from the photonic integrated circuit. The optical path may be coupled to a connector positioned on the thermal transfer plate for receiving or transmitting the optical signal. The connector may also be configured for receiving power (e.g., multi-phase pulse power), which may be delivered to the POL for distribution through the thermal transfer plate.

The embodiments described herein operate in the context of a data communications network including multiple network devices. The network may include any number of network devices in communication via any number of nodes (e.g., routers, switches, gateways, controllers, edge devices, access devices, aggregation devices, core nodes, intermediate nodes, power sourcing equipment, powered devices, or other network devices), which facilitate passage of data within the network. One or more of the network devices may comprise one or more power and optics distribution systems and heat dissipation system described herein. The network device may further include any combination of memory, processors, power supply units, and network interfaces.

Referring now to the drawings, and first to FIG. 1, a block diagram illustrating an example of power distribution through a POL power supply located on a board 10 is shown, in accordance with one embodiment. In one or more embodiments, optics 11 are integrated with the power system and an optical path is created to transmit optical signals through the thermal transfer plate and substrate to or from a photonic chip 13 (photonic die, photonic integrated circuit, integrated optical circuit) integrating multiple photonic functions.

Power is delivered at element 12 to a plurality of POLs (POL modules (circuits), power components) 14a, 14c, 14d, 14e. In one example, pulse power at a voltage greater than 100V (e.g., 108V, 380V) or any other suitable voltage, is delivered to the fixed POL 14a. The power source 12 may also deliver pulse power to POLs 14c, 14d, and 14e (e.g., fixed POLs). In another example, the power source 12 delivers 54VDC (or any other suitable voltage (e.g., intermediate bus voltage level selected based on overall system efficiency, routeability, and cost)) to POL modules 14c, 14d, 14e. The fixed POL 14a transfers power (e.g., at 54VDC or other voltage) to the regulated POL (POL converter, POL regulator) 14b, which distributes power to ASICs 16 (e.g., integrated circuit, die, chip, multi-chip module (MCM), and the like). As described below, the fixed POL 14a may be connected to the regulated POL 14b through a bus bar interconnect or any other suitable electrical connection. The regulated POL 14b may provide, for example, 150 amp or greater output. Each power connection may also include 10 Mbps (or any other data rate) communications. In the example shown in FIG. 1, power is delivered from the regulated POL module 14b to the ASICs 16 via a voltage rail. Power may be provided to the ASICs 16 in a multi-drop arrangement, for example.

It is to be understood that the term "POL module" as used herein may refer to various types of POL configurations, including, for example, discrete POLs and modules or power delivery block-based voltage regulator designs. Also, it may be noted that the POLs may be single phase or multi-phase POLs that may work together to deliver one or more output.

System components (POL modules, thermal transfer plates, electronic and photonic package (substrate and die package)) are connected to the board 10. The board 10 may comprise a printed circuit board or the components may be directly attached to sheet metal modules, a line card, or any other suitable support member. For example, a line card circuit board may be removed and the electronic package interconnected through fiber and copper connections at the ASIC edge. As described below, the thermal transfer plate may be positioned on either side of the substrate and die package, or both sides of the substrate and die package, with electronics, optics, or both electronics and optics delivered through one thermal transfer plate (top, bottom) or both thermal transfer plates.

As previously noted, pulse power may be supplied to one or more of the POL modules. The term "pulse power" (also referred to as "pulsed power") as used herein refers to power that is delivered in a plurality of voltage pulses (sequence of voltage pulses) 18a in which voltage varies between a very small voltage (e.g., close to 0V, 3V) during a pulse-off time 19a and a larger voltage (e.g., ≥12V) during a pulse-on time 19b. High voltage pulse power (high voltage pulses) (e.g., >56V, ≥60V, ≥300V) may be transmitted from power sourcing equipment (PSE) to a powered device (PD) for use in powering the powered device, whereas low voltage pulse power (low voltage pulses) (e.g., ~12V, ~24V, ≤30V, ≤56V) may be used over a short interval for start-up (e.g., initialization, synchronization, charging local energy storage, powering up a controller, testing, or any combination thereof). Pulse power transmissions may be through cables, transmission lines, bus bars, backplanes, PCBs, or power distribution systems, for example.

In one or more embodiments, the pulse power may be delivered in multiple phases (18b, 18c in FIG. 1), with the pulses offset from one another between phases to provide continuous power. One or more embodiments may use multi-phase pulse power to achieve less loss, with continuous uninterrupted power with overlapping phase pulses to a powered device, as described in U.S. patent application Ser. No. 16/380,954 ("Multiple Phase Pulse Power in a Network Communications System"), filed Apr. 10, 2019, which is incorporated herein by reference in its entirety.

It is to be understood that the voltage, power, and current levels described herein are only provided as examples and power may be delivered at different levels (volts, amps, watts) than described herein without departing from the scope of the embodiments. Power may be received as ESP (Extended Safe Power) (also referred to as FMP (Fault Managed Power)) (e.g., pulse power, multi-phase pulse power, pulse power with fault detection and safety protection), PoE (Power over Ethernet), or in accordance with any current standard or future standard.

The term ESP (or FMP) as used herein refers to high power (e.g., >100 Watts (W)), high voltage (e.g., ≥56 Volts (V)) operation with pulse power delivered on one or more wires or wire pairs in a cable (e.g., Ethernet cable). In one or more embodiments, ESP includes fault detection (e.g., fault detection at initialization and between high voltage pulses), and pulse synchronization. As shown in FIG. 1, pulse power or multi-phase pulse power may be received at the fixed POL module 14a. In another example, the pulse power may be received at a connector mounted on the thermal transfer plate and transmitted to the fixed POL module through an interconnect.

Figure 2:
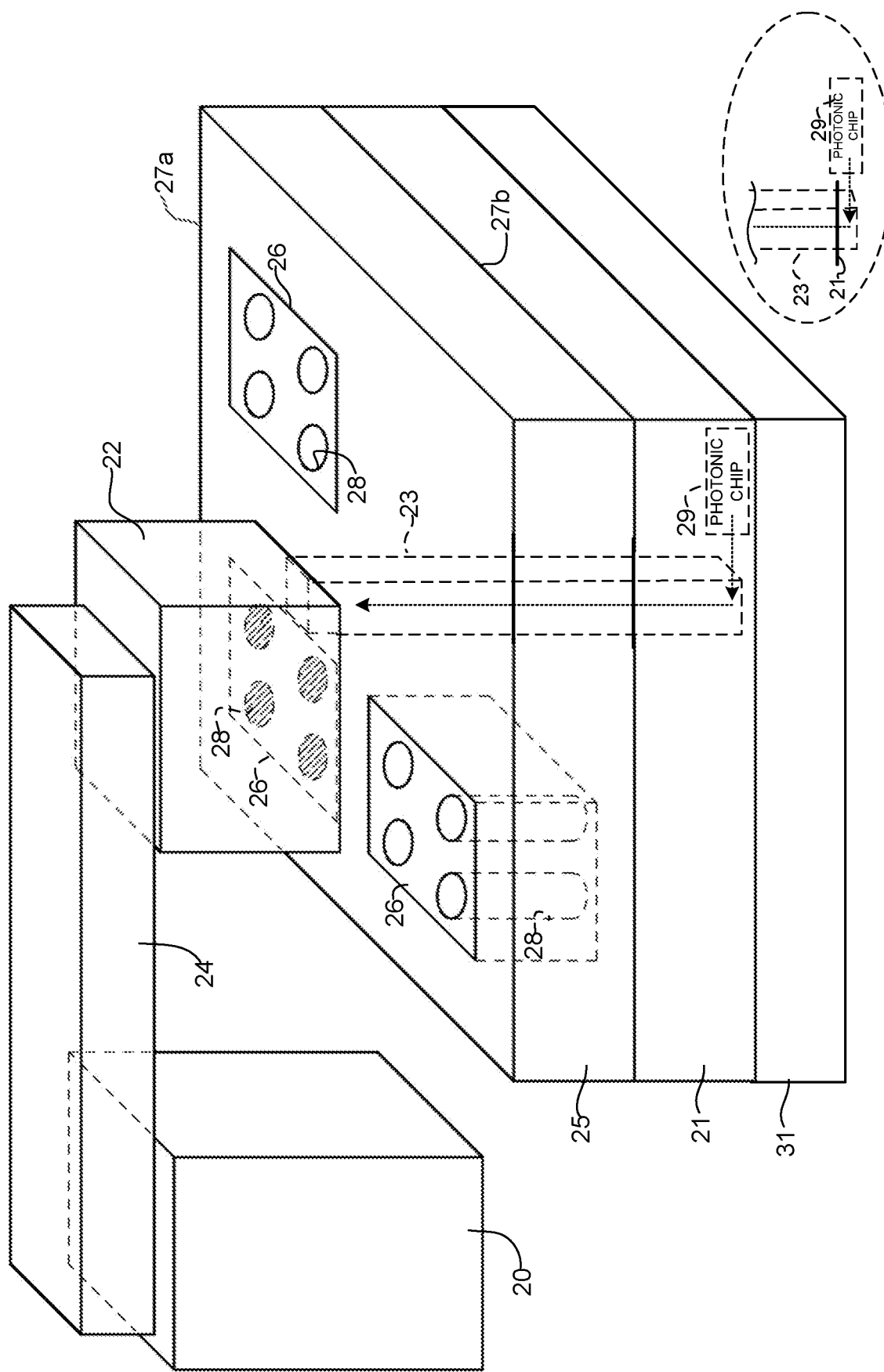
FIG. 2 is a schematic perspective of the POL modules and a thermal transfer plate comprising power blocks with power vias for delivery of power from the POL modules and an optical path for transmission of an optical signal through the thermal transfer plate, in accordance with one embodiment.

FIG. 2 is a perspective schematic illustrating a connection between a fixed POL 20 and a regulated POL 22, distribution of power through a thermal transfer plate 25, and transfer of optical data through the thermal transfer plate and a substrate and die package 21, in accordance with one embodiment. As described in detail below, the thermal transfer plate 25 (or thermal transfer plates 25, 31) (also referred to as a cooling plate, cold plate, or heat transfer plate) comprises a heat dissipation system defined by a vapor chamber system and MEMS module. For simplification, details of the heat dissipation system (e.g., vapor chamber integrated with thermal transfer plate, heat transfer tubes coupled to thermal transfer plate, fins coupled to heat transfer tubes) are not shown in FIG. 2.

The fixed POL module 20 may provide input power to the regulated POL module 22 via an electrical connection 24 comprising, for example, a bus bar, wire, or other interconnect. Only one POL module 22 is shown connected to the thermal transfer plate 25, however, any number of POL modules may be connected to the thermal transfer plate. Each POL may provide a single voltage rail or multiple voltage rails, as shown in FIG. 1. In the example shown in FIG. 2, an optical path 23 extends through the thermal transfer plate 25 and substrate for transmitting optical signals through the thermal transfer plate.

In one or more embodiments, an apparatus comprises the thermal transfer plate 25 comprising a first side 27a (upper surface as viewed in FIG. 2) and a second side 27b (lower surface) opposite to the first side, a photonic integrated circuit (chip) 29 connected to the substrate (e.g., printed circuit board, interposer, printed circuit board and interposer) positioned on the second side of the thermal transfer plate, and the optical path 23 extending through the thermal transfer plate 25 or thermal transfer plate 25 and the substrate (extending into the substrate and die package 21) and optically coupled to the photonic integrated circuit for transmitting an optical signal between the first side of the thermal transfer plate and the photonic integrated circuit.

The term "substrate" as used herein may refer to an electrical board, ceramic board, or an element formed from any other suitable material, and may refer to multiple elements (e.g., printed circuit board and interposer) or a single element or board. For example, the substrate may also comprise an interposer (e.g., glass element laser patterned with waveguides and plated with metal vias to form a combined optical path and electrical path). The substrate may comprise traces and pads embedded within or deposited on the substrate for connection with the power vias and die. Etching, deposition, bonding, or other processes may be used to form the traces and pads. The substrate may be bonded to the thermal transfer plate using solder processes, as well known by those skilled in the art. The electronic and optical package may comprise the substrate, one or more electronic integrated circuits (e.g., ASIC, NPU (Network Processing Unit), die, chip), and one or more optical engines (photonic integrated circuits) (SerDes (Serializer/Deserializer) chiplet) attached to the substrate. The electronic and optical package (also referred to herein as a substrate and die package) may comprise one or more integrated circuit, ASIC, NPU, MCM, die, chip, chiplet, processor, electronic component, or photonic component attached to one or more substrates. One or more embodiments may also include an optional lid between the multi-chip module and the thermal transfer plate.

It should be noted that the terms lower, upper, bottom, top, below, above, horizontal, vertical, and the like, which may be used herein are relative terms dependent upon the orientation of the package and components and should not be interpreted in a limiting manner. These terms describe points of reference and do not limit the embodiments to any particular orientation or configuration.

Thus, the thermal transfer plate 25 configured to distribute the power and optics may be positioned above the substrate and die package 21 or below the substrate and die package. As shown in the alternate view, for example, the optical path 23 may be coupled directly to the photonic die 29 rather than going through the substrate first. Also, as described below, the power, optics, or both power and optics may be distributed to the substrate and die package 21 through both thermal transfer plates 25 and 31. For example, the assembly shown in FIG. 2 may be rotated 180 degrees (flipped vertically) and the POL module 22 mounted on an outer surface of a lower thermal transfer plate. Also, as described below, power and optical signals may be transmitted through both thermal transfer plates, in which case the module 22 will be mounted on the outer surface (surface not adjacent to substrate and die package 21) of both thermal transfer plates 25, 31, with electrical paths 28 and optical path 23 in both plates 25, 31.

The optical path 23 is created to allow light (indicated by arrow in optical path) to pass through the thermal transfer plate 25 and substrate 21 to reach the optical engine (photonic integrated circuit, chip, die) 29. The optical path 23 may comprise, for example, one or more waveguides or an opening for receiving fiber optics. In one or more embodiments, the optical path 23 may be configured for light, laser written waveguides in glass, free space optics, or optical fiber, for example. A cutout may be made in the thermal transfer plate and substrate with passageway 23 inserted therein to link POL module 22 and bus bar 24 to the photonic chip 29. In one example, optics are integrated with power delivery over bus bar 24. The optical path 23 may be aligned and optically coupled to the photonics die 29 and module 22 as shown in FIG. 2, or may interconnect with a connector having interlocking features. The optical path 23 may be attached to the chip 29 using active or passive alignment processes and adhesive, such as an index matching epoxy. The optical path may also be coupled to an edge, top, or bottom of the die 29. Various coupling approaches may be used including, for example, edge coupling, vertical coupling, etc.

In one or more embodiments, the optical path 23 may be part of a dedicated cutout separate from the electronics as shown in FIG. 2. In one or more embodiments, the optical path and electrical path may be defined along the same cutout in the thermal transfer plate 25. For example, a piece of glass may be laser patterned with waveguides and plated with metal vias to form a combined optical path and electrical path. Also, more than one optical path 23 may be formed in the thermal transfer plate 25 and substrate to communicate with one or more photonic die 29.

In one or more embodiments, the optical path 23 may be constructed from an optical bulk material (e.g., $SiO_2$ or other suitable material) in which a plurality of waveguides and mirrors are defined, as described in U.S. patent application Ser. No. 16/546,084 ("Periscope Optical Assembly"), filed on Aug. 20, 2019, which is incorporated herein by reference in its entirety. The optical path 23 may comprise an optical path structure (e.g., periscope optical assembly) comprising, for example, one or more waveguide, mirror, lens, optical grating, filter, or any combination thereof. The optics may be defined by various processes in the bulk material based on the refractive index and the angle of light passing from one region to another. For example, a waveguide may be defined to confine light to a predefined path in the bulk material, whereas optics (e.g., a mirror) may redirect light received in one direction to a second direction. Other optics may have other effects on light carried in the bulk material, such as a lens focusing/converging or diffusing/diverging incoming light, an optical grating splitting and diffracting light into several beams, a filter removing, blocking, attenuating, or polarizing certain wavelengths of light, etc. Laser patterning may be used to define paths of the waveguide and a physical or chemical etching process may be used to form the mirror. The mirror may be defined, for example, as three-dimensional reflective structures within the bulk material or the mirror may be defined via a reflective surface treatment.

It may also be noted that the optical path 23 may be formed from one piece or multiple pieces combined together as described in U.S. patent application Ser. No. 16/842,393 ("Integration of Power and Optics Through Cold Plate for Delivery to Electronic and Photonic Integrated Circuits"), filed Apr. 7, 2020, which is incorporated herein by reference in its entirety. It is to be understood that these are only examples and other processes may be used to define optics within the optical path 23 or other optical components may be used, without departing from the scope of the embodiments.

As previously described, in addition to providing the optical path 23 through the thermal transfer plate 25, one or more electrical paths 28 may be created in the thermal transfer plate. As shown in the example of FIG. 2, the thermal transfer plate 25 comprises a plurality of power delivery blocks 26 each comprising a plurality of power vias (electrical paths) 28 for transmitting power through the thermal transfer plate, from the POL module 22 to an electronic package 21 (substrate and die package). Power is transmitted from a first side of the thermal transfer plate 25 (e.g., upper surface 27*a* as shown in FIG. 2) to a second side (e.g., lower surface 27*b* as shown in FIG. 2) of the thermal transfer plate opposite and generally parallel to the first side. In one or more embodiments, the power delivery block 26 comprises a small (miniature) power printed circuit board. Based on the application, other components may also be inserted into the thermal transfer plate 25 or strategically placed cutouts may be used.

The power delivery block 26 comprises a plurality of through holes (vias) 28, which extend through the entire thickness of the power delivery block (as shown in phantom in FIG. 2) and are plated along their interior surfaces. The through hole may, for example, be created using a drilling process and plated with a metallic material (e.g., copper or any conductive or metallic layer). The plating may effectively cover the barrel of the hole and create the electrical path 28 through the thermal transfer plate 25.

The term "power delivery block" as used herein may refer to any block of thermal and conductive material in which electrical paths (e.g., power vias) may be formed to allow for the passage of power directly through the thermal transfer plate 25. Although the term "printed circuit board" is used herein as an example of a substrate for the power delivery block 26, in other implementations the PCB may be replaced with other substrates (e.g., ceramic circuit boards) or other elements. Also, non-printed circuit boards may be used for the power delivery block 26. For example, a piece of glass may be laser patterned with waveguides and plated with metal vias to form a combined optical path and electrical path. Also, as previously noted, other components in addition to or instead of the PCB may be inserted into the thermal transfer plate 25.

In one or more embodiments, an additional thermal transfer plate 31 may be used, with the substrate and die package 21 interposed between the two thermal transfer plates 25, 31 to provide additional cooling. It may be noted that use of the second thermal transfer plate 31 is optional based on power and cooling requirements. As previously noted and described below, power and optics may be distributed through both thermal transfer plates 25, 31.

Also, it is to be understood that the thermal transfer plate 25, 31 may comprise any number of individual thermal transfer plates. For example, the thermal transfer plate may comprise two or more smaller thermal transfer plates with one or more of the power delivery block, electrical path, or optical path interposed therebetween.

One or both of the thermal transfer plates 25, 31 may comprise liquid, gas, or multi-phase based cooling including, for example, a MEMS integrated vapor chamber, as described below. The through power vias 28 may deliver 10 amps per tube, for example, and may be cooled by the thermal transfer plate 25. In one or more embodiments, the thermal transfer plate 25 is formed with one or more openings for insertion of one or more power delivery blocks 26, which may be, for example, press fit into the thermal transfer plate 25. An epoxy resin or adhesive fill may be used to press and position the power delivery block 26 within the thermal transfer plate 25. The epoxy resin may be used to account for tolerances between the power delivery block 26 and thermal transfer plate opening. If the thermal transfer plate 25 utilizes cooling tubes or reservoirs, these are routed or positioned around the power delivery block and optical path openings. The thermal transfer plate 25 keeps a temperature rise low for the power vias 28, thereby maximizing current transfer from the POL 22 to the substrate and die package. In one example, the thermal transfer plate 25 is configured with multiple internal zones to maintain optical temperature below 75 degrees Celsius. It is to be understood that the thermal transfer plate and temperature described herein are only examples and other designs may be used to maintain cooling at different temperatures.

In one or more embodiments, the power block, power vias, and thermal transfer plate may be configured as described in U.S. patent application Ser. No. 16/743,371 ("Power Distribution from Point-of-Load With Cooling"), filed Jan. 15, 2020, which is incorporated herein by reference in its entirety.

The power delivery blocks 26 and vias 28 formed therein extend through the thermal transfer plate 25 to provide power to the attached electronic package (substrate and die package) 21. For simplification, only a portion of the power delivery blocks 26 and vias 28 are shown in phantom extending through the thermal transfer plate 25. Also, the substrate and die package 21 is shown as a single block structure, but it is to be understood that the package may comprise one or more substrates with any number of components (e.g., electronic integrated circuit, ASIC, photonic integrated circuit, optical engine, die, chip, chiplet, FAU (Fiber Attachment (Array) Unit), CAU (Copper Attachment (Array) Unit)) attached thereto. In one or more embodiments, the substrate and die package comprise in-package optics.

In addition to passing power through the power delivery block 26, communications (e.g., control plane communications) may also pass through the power delivery block. In one or more embodiments, control communications for the regulated POL and for the ASIC to a system FPGA (Field-Programmable Gate Array) may pass through the thermal transfer plate 25 or through ribbon cables. In one or more embodiments, communications may pass through communication vias (not shown) formed in the power delivery blocks, which may include both power vias and communication vias or only communication vias. In one example, lower speed communications may pass through the POL (e.g., 200 Mbps range). The thermal transfer plate 25 may include any combination of power delivery blocks with power vias, communication vias, or optical paths. Control plane communications may also be provided through separate communications elements (e.g., via ribbon cable or other means), which may be used to move control communications in and out of the package. In one or more embodiments full speed PCIe (Peripheral Component Interconnect express) or faster may be used. The thermal transfer plate 25 may be connected to any number or combination of POL modules 22 and communication modules.

It is to be understood that the configuration shown in FIG. 2 is only an example, and the thermal transfer plate 25, 31 may include any number, combination, or arrangement of power blocks 26, optical paths 23, and communication paths. For example, multiple optical paths may be attached or plugged together to create an optical path between an outer surface of the thermal transfer plate and the photonic die. The optical path may be formed from various materials (e.g., glass, heat-resistant polymers, etc.) using various processes. In one example, laser patterning of glass may be used to write waveguides and precisely write and etch mechanical features such as plugs for interlocking slots. Laser patterning may also be used to pattern other glasses such as gorilla glass (chemically strengthened glass) or flexible glass. As previously noted, mirrors, lenses, or other optics may also be patterned into the optical path. An electrical via with plated metal may also be created in the laser patterned structure to allow electrical signals to be routed in the same structure as the optical signals.

In one or more embodiments, optical signals and pulse power may be received from a connector inserted into a connector cage coupled to the optical path. As previously described with respect to FIG. 2, the fixed POL module 20 is coupled to the regulated POL module 22 via the power bridge 24. A high power (ESP, pulse power) bridge may also be provided to connect the fixed POL 20 to the connector (connector cage) positioned on a first (upper) side of the thermal transfer plate. In one example, multi-phase pulse power may be transmitted from the electrical interfaces to the high-power bridge via an electrical path integrally formed with the optical path or by other means through the connector. As previously described with respect to FIG. 1, the multi-phase pulse power may be modified before being transmitted from the fixed POL module 20 to the regulated POL module 22. Optical signals are received at an optical interface and power (e.g., multi-phase pulse power) is received at electrical interfaces at the connector. In one or more embodiments, the optical interface may comprise a photonic element (e.g., photonic die) and may be configured for mating with an MPO (Multi-fiber Push On) type connector. For example, in one or more embodiments, the optical portion of the connector assembly may be configured as shown and described in U.S. patent application Ser. No. 16/544,699 ("Connection Features for Electronic and Optical Packaging"), filed Aug. 19, 2019, which is incorporated herein by reference in its entirety.

Figure 3:
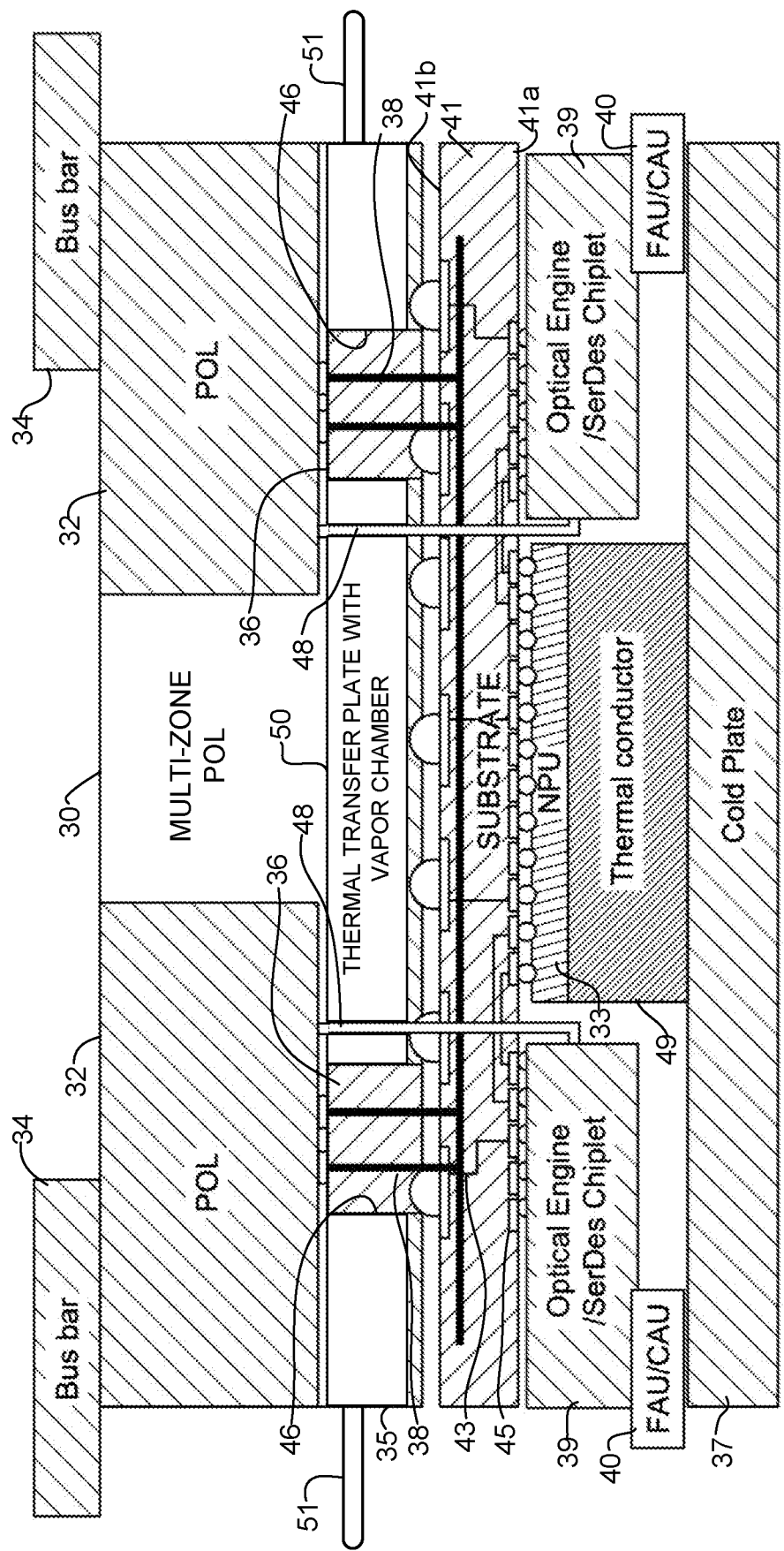
FIG. 3 is a cross-sectional view illustrating a substrate and die package with the thermal transfer plate and POL modules, in accordance with one embodiment.

Referring now to FIG. 3, a cross-sectional schematic illustrates an apparatus comprising a substrate 41 having a first surface 41a and a second surface 41b opposite to the first surface, integrated circuits (one or more die (chip)) 33, 39 attached to the first surface of the substrate, and a thermal transfer plate 35 attached to the second surface of the substrate and comprising an electrical path (e.g., power via) 38 extending therethrough for transmitting power from a power component (e.g., POL module) 32 to an electronic integrated circuit 33 and optical paths 48 for transmitting one or more optical signals to or from a photonic integrated circuit (photonic chip, optical engine) 39. The term "substrate" as used herein may refer to an electrical board, ceramic board, or an element formed from any other suitable material. The substrate may also comprise an interposer (e.g., glass element laser patterned with waveguides and plated with metal vias to form a combined optical path and electrical path).

Bus bars 34 are shown connected to a multi-zone POL 30 (e.g., with DC power to rail voltage) with POL modules 32 attached to the thermal transfer plate 35 and configured to distribute power from the POL modules to an electronic and optical package comprising the substrate 41, the electronic integrated circuit 33 (ASIC, NPU (Network Processing Unit), die, chip), and two optical engines (photonic integrated circuits) 39 (SerDes (Serializer/Deserializer) chiplet) attached to the substrate. The electronic and optical package (also referred to herein as a substrate and die package or in-package optics (photonics)) may comprise one or more integrated circuit, ASIC, NPU, MCM, die, chip, chiplet, processor, electronic component, or photonic component attached to one or more substrates. In the example of FIG. 3, the substrate and die package includes the substrate 41, NPU 33, optical engines 39 and FAU/CAU 40. It is to be understood that this is only an example and the substrate and die package may include any number of components in any arrangement. The FAU/CAU 40 may be attached to a lower surface of the optical engine 39 (as shown in FIG. 3) or positioned on an upper surface or side of the optical engine 39, or may be removed if optics and power are transmitted by another means. In the example of FIG. 3, a second cold plate 37 is thermally coupled to the NPU 33 through a thermal conductor (interposer) 49. The thermal conductor (or a plurality of thermal conductors) may be positioned across multiple die. One or more embodiments may also include an optional lid between the multi-chip module and the cold plate 37.

In the example shown in FIG. 3, two optical paths 48 extend through the thermal transfer plate 35 and substrate 41 and are optically coupled to a side of the photonic chips 39. The optical path 48 may also be coupled to the photonic chip 39 along a lower edge of the chip. As previously described with respect to FIG. 2, optical signals may be transmitted along with power at the POL module 32.

As previously described, the thermal transfer plate 35 includes one or more power delivery blocks 36 (e.g., PWR PCB) inserted into the thermal transfer plate, with one or more electrical paths (power vias) 38 formed therein. In one or more embodiments, the power delivery blocks 36 are formed separately from the thermal transfer plate 35 and inserted into openings 46 formed in the thermal transfer plate for receiving the blocks. As discussed above, an epoxy resin or adhesive fill may be used to press and position the power delivery blocks 36 within the openings 46 in the thermal transfer plate 35.

The substrate 41 may comprise traces 43 and pads 45 embedded within or deposited on the substrate for connection with the power vias 38 and die 33, 39. Etching, deposition, bonding, or other processes may be used to form the traces and pads. The substrate 41 may be bonded to the thermal transfer plate 35 using solder processes, as well known by those skilled in the art.

Figure 4:
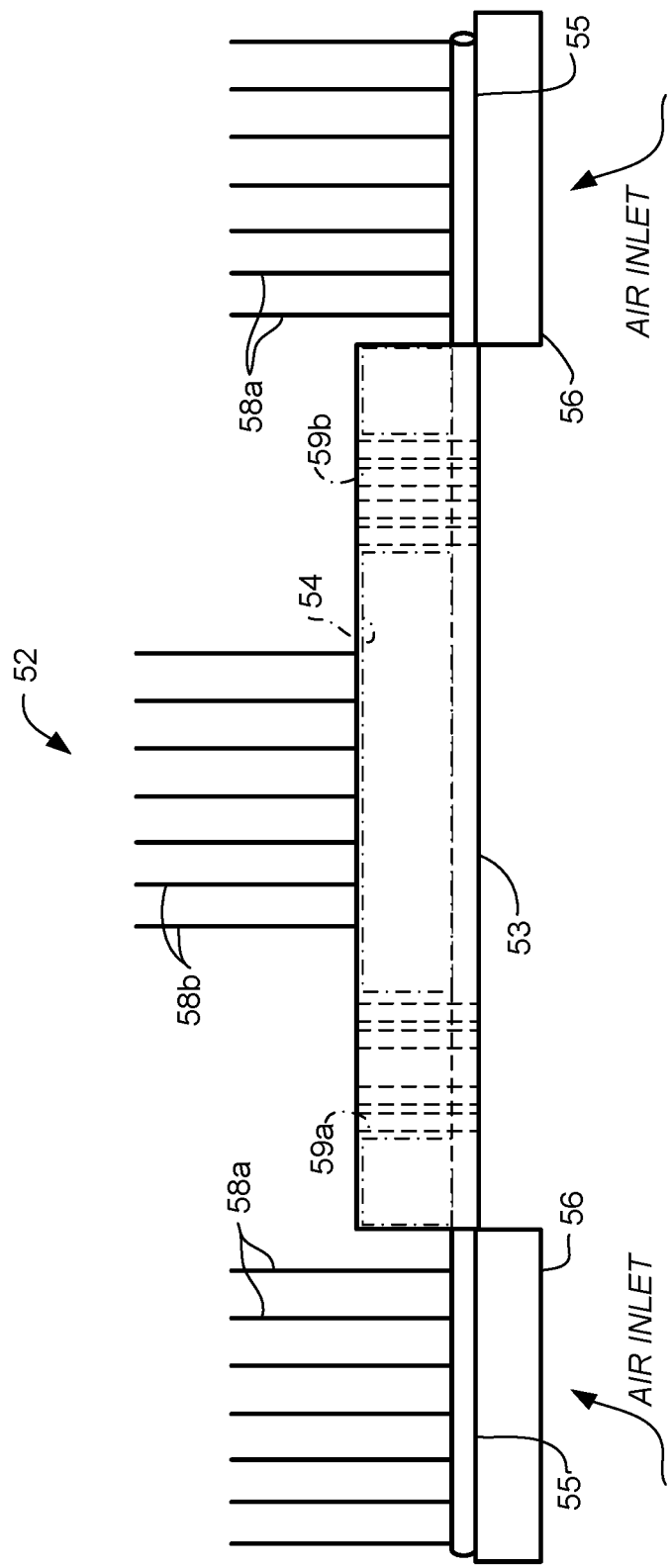
FIG. 4 is a schematic front view of a heat dissipation system comprising a vapor chamber assembly and a Micro-ElectroMechanical System (MEMS), in accordance with one embodiment.

In the example shown in FIG. 3, the thermal transfer plate 35 comprises a vapor chamber 50 (e.g., internal two-phase evaporation and condensation to passively transfer heat through the thermal transfer plate) and heat transfer elements (heat pipes, vapor tubes, cooling tubes) 51 extending outward from opposite sides of the thermal transfer plate. As described below with respect to FIG. 4, a MEMS module is positioned below the heat transfer elements 51 (as viewed in FIG. 3) to push air upwards over heatsink fins coupled to the heat transfer elements (as shown in FIG. 4). For simplification, the MEMS modules and fins are not shown in FIG. 3. The vapor chamber 50 comprises one or more sealed chambers containing a working fluid. The sealed chamber has a first end proximate the substrate and die package (heat source). The working fluid is in a liquid phase proximate the heat source, increases in temperature and evaporates to form a gaseous phase of the working fluid, which moves towards a second end of the sealed chamber. As the gaseous phase moves toward the sealed chamber second end, it condenses to again form the liquid phase of the working fluid, thereby releasing the heat absorbed during the evaporation of the liquid phase of the working fluid. This process is repeated to transfer heat away from the heat source. As described below, the vapor chamber 50 may have various configurations with the chambers (reservoirs or tubes) routed or positioned around the power delivery block openings 46 and optical path openings 48.

It is to be understood that the components and arrangement shown in FIG. 3 is only an example and other types or number of components with different sizes and arrangement, or additional components may be used without departing from the scope of the embodiments. For example, one or more integrated circuits may be positioned on an upper surface of the thermal transfer plate 35 (side opposite the substrate 41). In one or more embodiments, the thermal transfer plate 35 may only include the optical path 48 with electrical power being supplied to the electronic integrated circuit (NPU) 33 via another path.

Also, as previously noted, the terms lower, upper, bottom, top, below, above, and the like, are relative terms dependent upon the orientation of the package. Thus, the thermal transfer plate 35 may be the "lower thermal transfer plate", with the optical and electrical paths extending upward through the thermal transfer plate to the substrate and die package. The cold plate 37 may be replaced with the thermal transfer plate 35 with vapor chamber. The optical and electrical paths may be in both thermal transfer plates for power and optical signal distribution from both sides of the substrate and die package. The optical engine 39 may also be positioned on an upper surface of the substrate 41. In the example shown in FIG. 3, a cold plate 37 is shown without a vapor chamber or electrical and optical paths. As described below, a heat dissipation system may be positioned on one or both sides of the substrate and die package.

Figure 7:
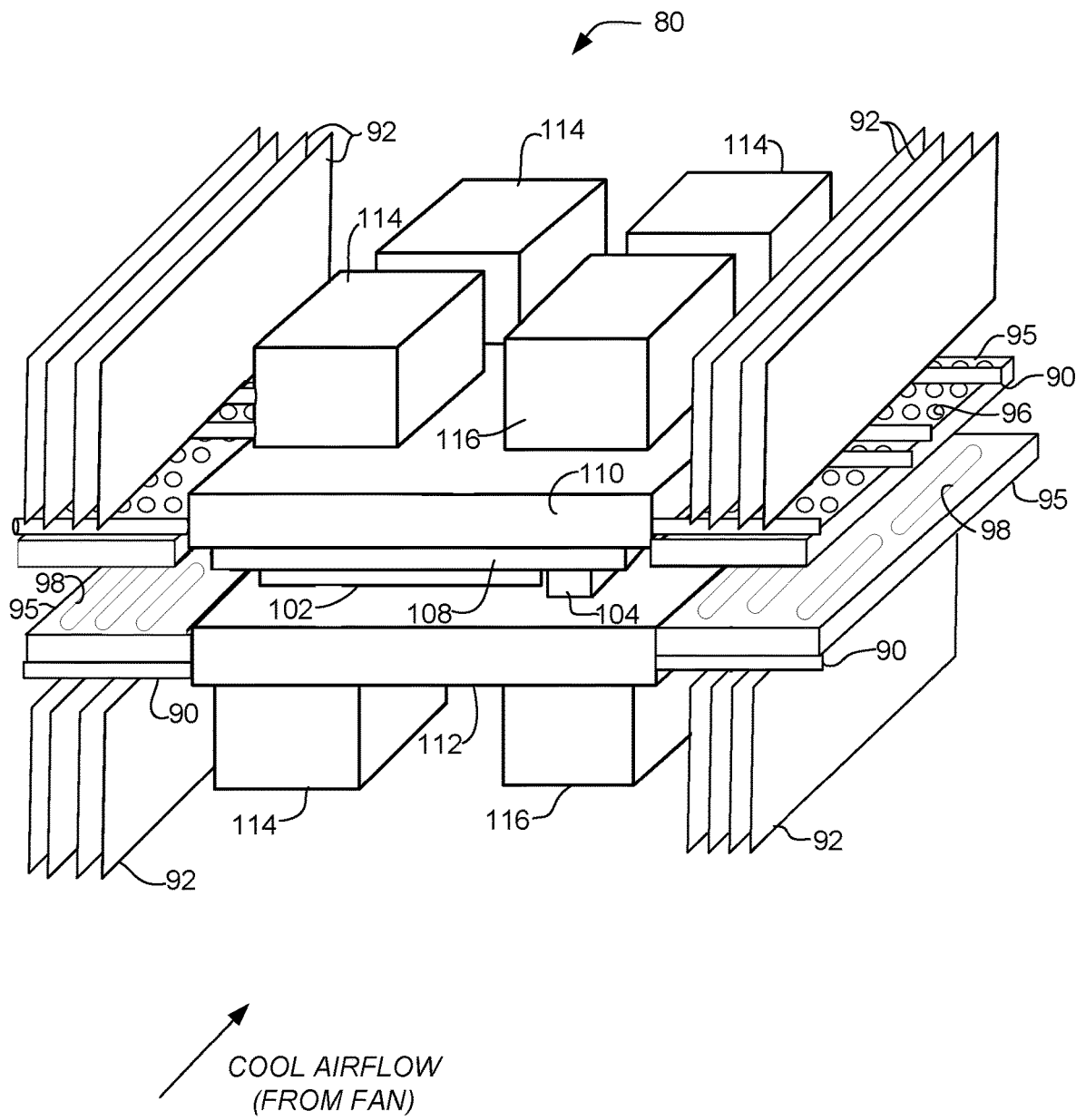
FIG. 7 is a schematic perspective of the substrate and die package interposed between two heat dissipation systems with POL modules and optical connectors mounted on the heat dissipation system, in accordance with one embodiment.

FIG. 4 is a schematic front view of a heat dissipation system, generally indicated at 52, in accordance with one embodiment. In the example shown in FIG. 4, a thermal transfer plate 53 comprises a vapor chamber 54 and one or more heat transfer elements 55 (e.g., heat pipes, vapor tubes, cooling tubes, graphene enhanced copper tubes) extending laterally through the thermal transfer plate. MEMS modules 56 are positioned adjacent to the thermal transfer plate 53 and below the heat pipes 55 The MEMS modules 56 may be, for example, positioned below the thermal transfer plate 53 and coupled to the heat transfer elements 55 or coupled to the thermal transfer plate. The vapor chamber 54 may also be positioned below the heat transfer elements 55. As described in detail below, air enters an air inlet on a lower surface of the MEMS module 56 and exits through an upper surface (as viewed in FIG. 4). In the example shown in FIG. 4, the heat dissipation system comprises a plurality of heat sink fins 58a extending upward from the heat transfer elements 55 and a plurality of heat sink fins 58b extending from an upper surface of the thermal transfer plate 53, and defining a plurality of air flow channels. The fins 58a, 58b may be formed, for example, from copper, aluminum, or another suitable material and are used to remove heat by forced convection. The high surface area of the fins 58a, 58b allows heat to be convectively dissipated from the fins into the air surrounding the fins. The air from the MEMS module 56 enhances the convective heat dissipation as it flows out an upper surface of the MEMS module and over the fins It is to be understood that the shape, size, location, or number of fins 58a, 58b may be different than shown herein, without departing from the scope of the embodiments. Also, the heat dissipation system 52 may be configured without fins. The fins 58b positioned above the thermal transfer plate 53 may be attached to an upper surface of the plate (as shown in FIG. 4) or extend into the plate and coupled directly with an outer surface of the vapor chamber 53 or heat transfer elements 55. While the fins 58a are shown mounted on the heat transfer elements 55, the heat transfer elements 55 may also extend through the fins. In another example, the heat dissipation system 52 may only include the fins 58a positioned above the MEMS modules (as shown in FIG. 7).

The thermal transfer plate 53 may comprise a vapor chamber 54 (multi-phase heat transfer system) comprising a sealed enclosure that extends around electrical and optical passageways (paths) 59a, 59b that pass through the thermal transfer plate. In another example, the vapor chamber may comprise a plurality of individual sealed enclosures located throughout the thermal transfer plate 53 and spaced between the electrical and optical passageways. The vapor chamber 54 may also be cylindrical in shape and extend around a periphery of the thermal transfer plate 53 (or a portion thereof). The vapor chamber 54 may comprise heat pipes (heat transfer tubes) 55, which may be integral with the vapor chamber 53 within the thermal transfer plate 53 or positioned adjacent to the vapor chamber (or vapor chambers) positioned within the thermal transfer plate. The heat transfer elements 55 may comprise individual heat pipes extending from each side of the thermal transfer plate 53 to dissipate heat outward from the plate. The heat transfer element (tube) 55 is positioned adjacent to the air outlet of the MEMS modules 56.

The heat dissipation system 52 may be located above, below, or both above and below the substrate and die package. Thus, as previously noted, use of terms above and below with respect to FIG. 4 are provided only for ease of description relative to the position shown in FIG. 4.

Figure 5B:
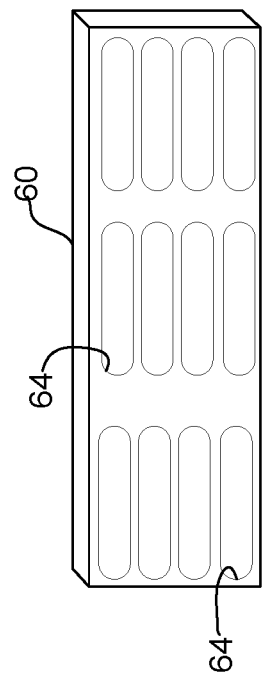
FIG. 5B is a bottom view of the MEMS block shown in FIG. 5A.
Figure 5D:
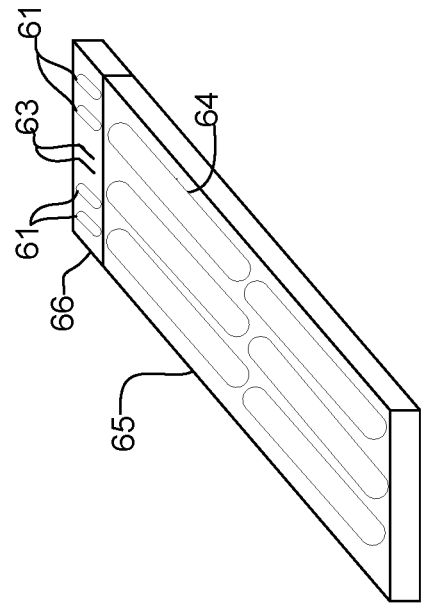
FIG. 5D is a bottom perspective of a MEMS module of FIG. 5C.
Figure 5A:
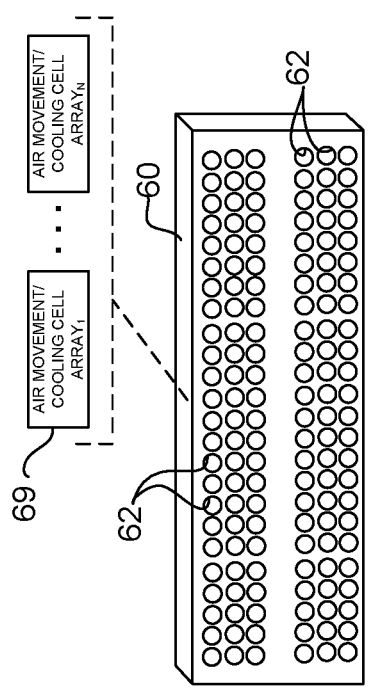
FIG. 5A is a top view of a MEMS block for use in the heat dissipation system, in accordance with one embodiment.
Figure 5C:
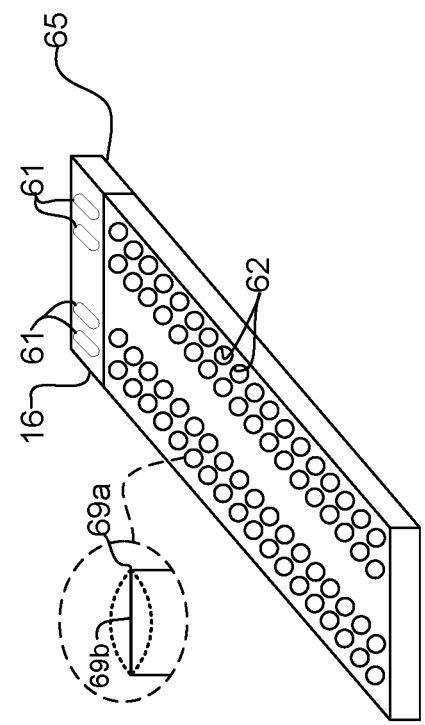
FIG. 5C is a top perspective of the MEMS block of FIG. 5A coupled to a power module, in accordance with one embodiment.

The following provides details of the MEMS module in accordance with one embodiment. Referring first to FIGS. 5A-5D, a MEMS block (device, element, array) 60 that may be used to dissipate heat from a heat generating component (e.g., electronic or photonic die (integrated circuit) or a device coupled to the heat generating component, is shown in accordance with one embodiment. FIG. 5A is a front view showing a plurality of exhaust ports (air exhaust, outlet) 62 and FIG. 5B is a rear view showing a plurality of air inlet ports (air entrance, inlet) 64. FIGS. 5C and 5D are top and bottom perspectives, respectively, of the MEMS block 60 shown in FIGS. 5A and 5B with a power unit (e.g., PWM (Pulse Width Modulation) power module) 66 coupled to the MEMS block 60. The MEMS block 60 and power unit 66 are referred to herein as a MEMS module 65. The power unit 66 is operable to control the plurality of air movement cells 69 and may comprise a pulse width modulation power controller, as described below.

In one or more embodiments, an apparatus comprises the MEMS module 65 comprising a plurality of air movement cells 69a (FIG. 5C) and a power unit 66 operable to control the plurality of air movement cells. The MEMS module 65 is operable to dissipate heat from the heat generating components.

The MEMS block 60 comprises any number of MEMS arrays (units) 69 (e.g., 1, 2, 3, 4, 5, 6 . . .), which may be individually controlled by the power unit 66 (FIG. 5A). Each MEMS array 69 may comprise one or more air movement cells (heat dissipation cells, cooling cells) 69a operable to create air pressure and air movement to dissipate heat away from the heat generating device, thereby providing cooling (FIG. 5C). Each air inlet 64 may provide air to any number of cells 69a and each cell may distribute air to one or more air outlet ports 62, with the cells arranged in any format. In one example, the cell 69a comprises a piezoelectric plate 69b or other suitable structure (e.g., one or more diaphragms) electrically coupled to the power unit 66 to drive the piezoelectric plate upward and downward as indicated by dashed lines in the enlarged cutout view of FIG. 5C. The power unit 66 actuates the plate 69b to vibrate between the positions shown in FIG. 5C. Vibration of the plate 69b pulls fluid (e.g., air) into the cell 69a (at air inlet 64) and drives fluid out of the cell (at air exhaust 62). The plate 69b may be operable to drive fluid from one side of the plate to the other (e.g., permeable material, orifices). In one or more embodiments, a thin film temperature sensor may be used to provide control feedback for the individual cells or groups of cells. The MEMS block 60 may comprise any number or type of MEMS cooling components in any arrangement.

The power unit 66 is connected to one end of the MEMS block 60 and may provide granular control of the MEMS block (e.g., individual cell/MEMS array/MEMS group control). As described below with respect to FIG. 6, the power unit 66 may include one or more power connections 61 (e.g., DC (Direct Current) power input) or data connections 63 (e.g., SPE (Single Pair Ethernet) connection). The power and data connections 61, 63 may be located on one or both sides of the power unit 66 or along an edge of the power unit.

Figure 6:
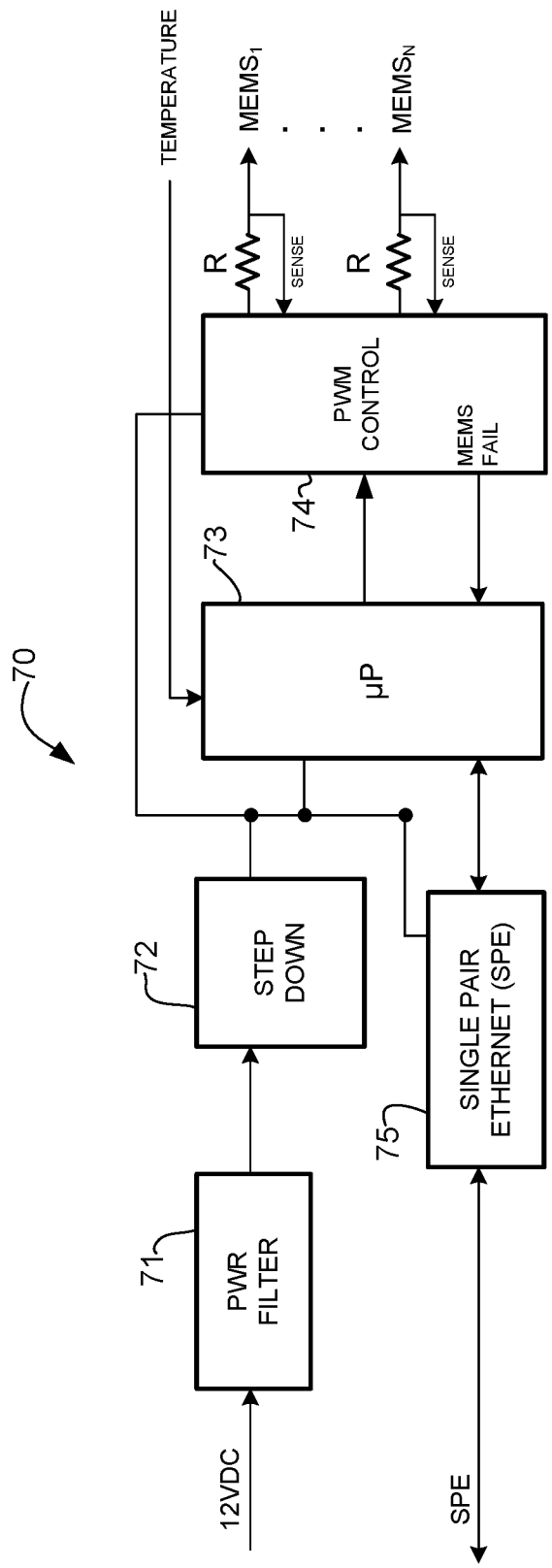
FIG. 6 is a block diagram of the power module, in accordance with one embodiment.

FIG. 6 is block diagram illustrating a circuit, generally indicated at 70, of the power unit 66 (FIGS. 5C and 5D), in accordance with one embodiment. In the example shown in FIG. 6, the power unit comprises a PWM (Pulse Width Modulation) power module comprising a power filter 71, a step-down device (DC-DC step-down converter) 72, a microprocessor (μP) 73, and a PWM controller 74. The power unit may receive, for example, 12VDC (or other IBV (Intermediate Bus Voltage)) at the power filter 71. The power is transmitted to the microprocessor 73 and PWM controller 74 after passing through the step-down device 72. In addition to receiving the power, the microprocessor 73 communicates over SPE (Single Pair Ethernet), or other suitable communications protocol at block 75. In one or more embodiments, the power unit may also be configured for MDIO (Management Data Input/Output) or I2C (Inter-Integrated Circuit)). As shown in FIG. 6, the PWM controller 74 may provide a MEMS fail signal to the microprocessor 73 based on monitoring of each MEMS unit (e.g., through one or more sense resistors R). For example, the PWM controller 74 may include a current sense to monitor for a MEMS failure, thereby allowing the microprocessor 73 to communicate status to system software using SPE. The PWM controller 74 controls operation of any number of MEMS units (and cooling/air movement cells) (MEMS$_1$ . . . MEMS$_N$). In one example, the PWM power unit may be configured to provide pulse DC at a frequency of 20 kHz to 100 kHz. The frequency range may be programmable.

In one or more embodiments, the microprocessor 73 receives a signal from a temperature monitor at (e.g., on or near) the heat generating component, which may be used to indicate if the component is below a specified temperature to regulate air flow through the MEMS. During normal operation, the PWM controller 74 may monitor the temperature and adjust airflow as needed. For example, the MEMS module 65 (or one or more MEMS units) may be powered down during periods of lower operating temperature. It is to be understood that the circuit 70 shown in FIG. 6 is only an example and changes may be made to the number, type, or arrangement of components at the power unit without departing from the scope of the embodiments.

FIG. 7 is a perspective of an assembly (apparatus), generally indicated at 80, comprising a substrate and die package (electrical die 102, optical engine 104) coupled to substrate 88) interposed between thermal transfer plates 110, 112. Electrical connectors (POL modules) 114 and optical connectors 116 are mounted on an outer surface of the thermal transfer plates 110, 112. As previously noted, each thermal transfer plate comprises a plurality of electrical paths and optical paths (shown in FIGS. 8 and 9).

In one or more embodiments, the apparatus 80 comprises the substrate and die package (electronic integrated circuit 102, photonic integrated circuit 104 mounted on substrate 108), the thermal transfer plate 110, 112 positioned adjacent to the substrate and die package for cooling the substrate and die package (removing (dissipating) heat from the substrate and die package), and the MEMS module 95 comprising a plurality of the air movement cells for dissipating heat from the thermal transfer plate.

In one or more embodiments, the apparatus 80 comprises the substrate and die package comprising at least one electronic integrated circuit and at least one photonic integrated circuit and a heat dissipation system for dissipating heat from the substrate and die package. The heat dissipation system comprises the vapor chamber 53 (shown in FIG. 4) and heat sink fins (fin stack, fins, ribs) 92 coupled to the vapor chamber (e.g., through heat transfer elements 90) and the MEMS module 95 comprising a plurality of the air movement cells 69 (FIG. 5A) operable to push air over (past, across) the heat sink fins.

In one or more embodiments, the substrate and die package may be interposed between two heat dissipation systems. As shown in FIG. 7, air enters the air inlet (air ports) 98 of the MEMS module 65 and exits the air outlet (exhaust ports) 96 of the MEMS module. In one or more embodiments, cool airflow may be directed at the apparatus 80 from a fan as indicated in FIG. 7.

In one or more embodiments, the thermal transfer plates 110, 112 comprises heat transfer elements 90 extending from opposite sides of the thermal transfer plate. The heat transfer elements 90 may comprise, heat pipes (vapor tubes) or may be formed from a heat conductive material such as graphene enhanced copper. The heat transfer elements 90 may be coupled to the vapor chamber positioned within the thermal transfer plate. The heat transfer elements 90 may comprise, for example, two separate multi-phase chambers that extend from the thermal transfer plate out opposite sides of the thermal transfer plate.

FIG. 7 illustrates an example in which power and optics are distributed through two thermal transfer plates 110, 112 with the substrate and die package interposed therebetween. In this example, three top attach POL modules 114 and one top attach optical connector 116 are positioned on a first (upper, outer) surface of the upper thermal transfer plate 110 for distributing power and optics through the thermal transfer plate, as previously described. The bottom attach POL module 114 and bottom attach optical connector 116 are shown positioned on a first (lower, outer) surface of the lower thermal transfer plate 112. As previously noted, the terms upper, lower, top, or bottom as used herein are relative terms dependent upon the orientation of the package and components and should not be interpreted in a limiting manner. These terms describe points of reference and do not limit the embodiments to any particular orientation or configuration. The configuration shown in FIG. 7 is only an example, and there may be any number or combination of POL modules and optical connectors positioned on a first (outer) surface of either or both thermal transfer plates 110, 112. Also, as previously described, the apparatus may include only one heat dissipation system or one heat dissipation system on one side of the substrate and die package and a cold plate without a vapor chamber or MEMS cooling or another side of the substrate and die package. The cold plate may include electrical or optical paths if additional power or optics distribution is needed at the package.

Figure 8:
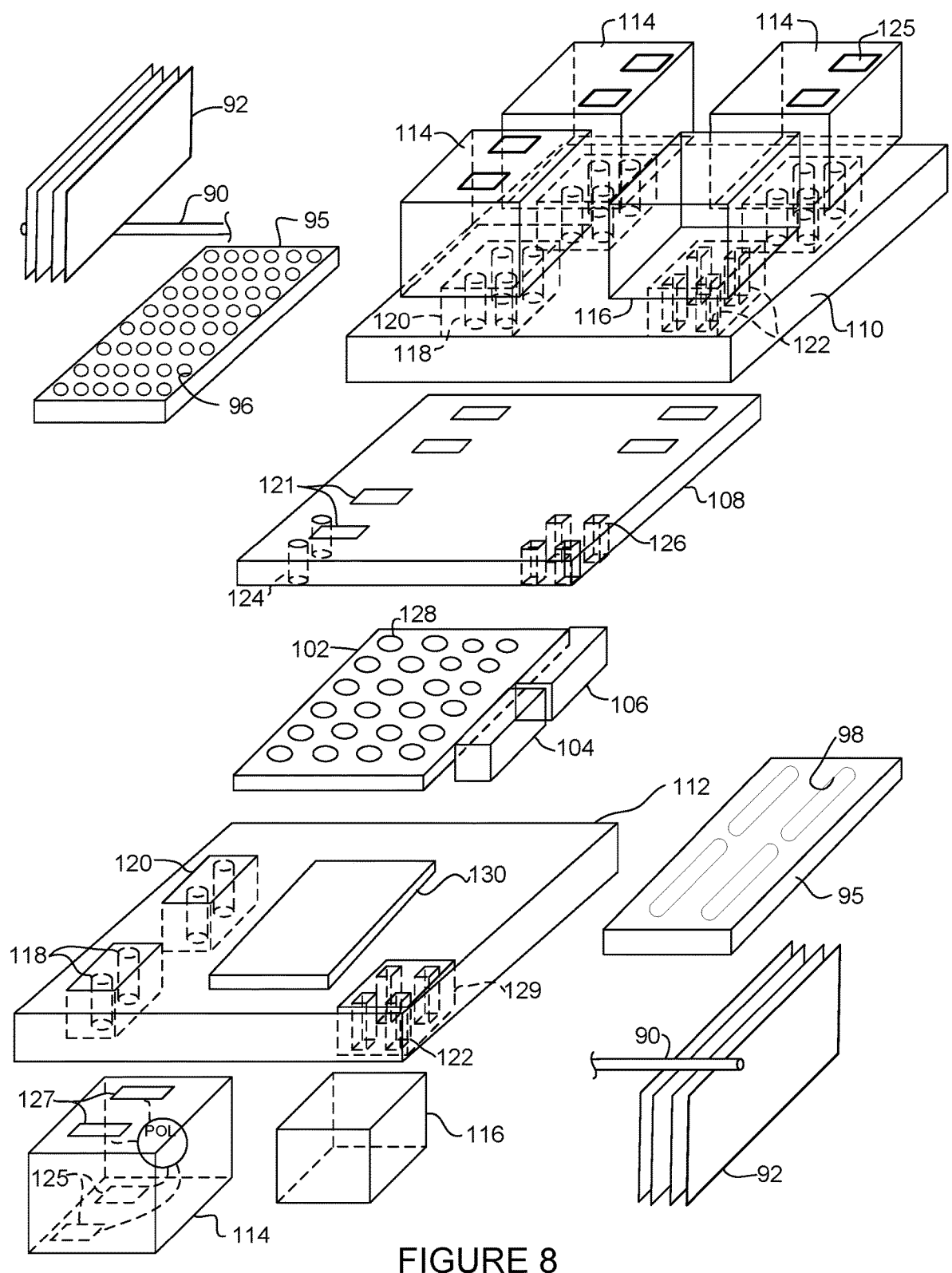
FIG. 8 is a partially exploded view of the assembly shown in FIG. 7 illustrating details of the substrate and die package and heat dissipation system.

FIG. 8 is a partially exploded view illustrating details of components positioned below the upper thermal transfer plate 110. The substrate 108 comprises a plurality of power/ground attach pads 121. Power/ground posts 124 are shown for attachment to a lower cold plate pass thru. Optical paths (wave guides) 126 extend through the substrate 108 for passing optical signals through the substrate, as previously described. Silicon die bumps 128 are shown on an upper surface of the die 102. In this example, the substrate and die package includes the optical engine 104 and SerDes chip 106. The optical engine 104 is positioned to receive or transmit optical signals from or to the optical connector 116 mounted on an outer surface of the cold plates 110, 112 (upper surface of upper cold plate 110, lower surface of lower cold plate 112). Each cold plate 110, 112 comprises electrical paths 118 in power blocks 120 and optical paths 122 in optical block 129. As previously noted, the electrical paths 118 may transmit power or electrical signals (e.g., communications) therethrough. A thermal pad 130 is positioned on an inner surface of the lower cold plate 112 for thermal contact with the die 102, as previously described. As described above with respect to FIGS. 4 and 7, one or more heat transfer tubes 90 may extend from one or both sides of the thermal transfer plate 110. Any number of heat sink fins 92 (fin stack, individual or coupled fins) may be mounted on the heat transfer tubes 90. The MEMS module 95 is positioned with the thermal transfer tube 90 interposed between the MEMS module 95 and fins 92 to push (force, expel) air received at the air inlet 98 out of the air exhaust 96 over the fins 92.

In the example shown in FIG. 8, the electrical connector 114 comprises two IBV (Intermediate Bus Voltage) or FMP (Fault Managed Power) power connections 125 electrically coupled to pads 127 for output power and ground for direct attach to the cold plate. It is to be understood that this is only an example, and the electrical connector may comprise any number of power and ground connection points.

Figure 9:
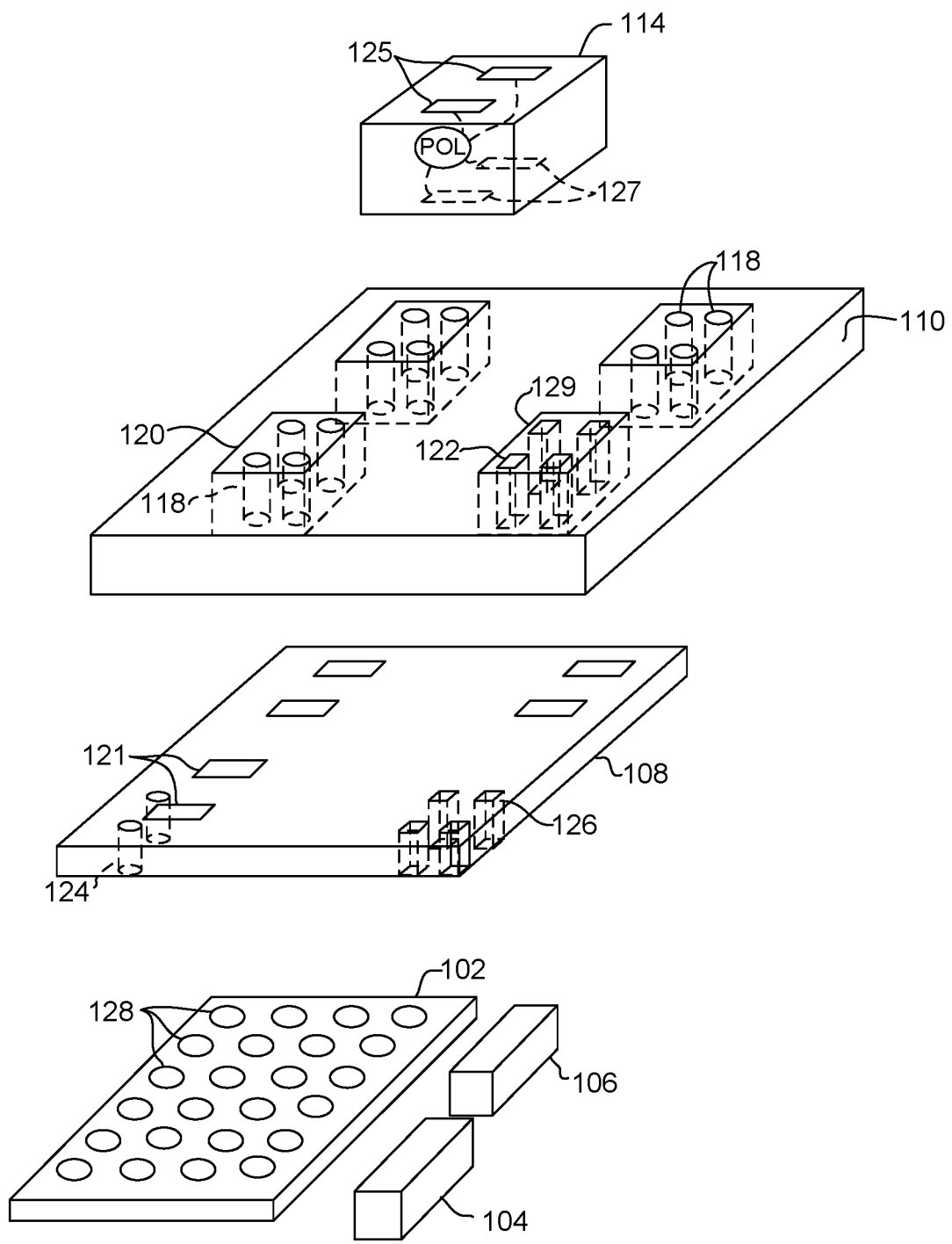
FIG. 9 is an exploded view of a portion of the assembly shown in FIG. 8 illustrating details of the substrate and die package and thermal transfer plate of the heat dissipation system.

FIG. 9 is an exploded view of one of the POL modules 114, upper thermal transfer plate 110, substrate 108, die 102, optical engine 104, and SerDes chip 106. The electrical connector 114 comprises power connection points 125, 127 as described above with respect to FIG. 8.

In the example shown in FIGS. 8 and 9, each thermal transfer plate 110, 112 comprises a plurality of electrical and optical paths for coupling with the electrical connectors 114 and optical connectors 116. In another example, only one of the thermal transfer plates may comprise an optical or electrical path. In yet another example, one of the thermal transfer plates may comprise only electrical paths and the other cold plate may comprise only optical paths. The thermal transfer plate may include any number of optical paths for transmitting optical signals and electrical paths for transmitting power or electrical signals (e.g., communications). Any number of electrical or optical connectors may be coupled (e.g., mounted on) one or both thermal transfer plates for electrical or optical connection with the electrical or optical paths. Also, although two individual thermal transfer plates are shown and described herein, the two thermal transfer plates may be physically connected (e.g., rotatable or moveable connection) or thermally coupled to one another.

Figure 10:
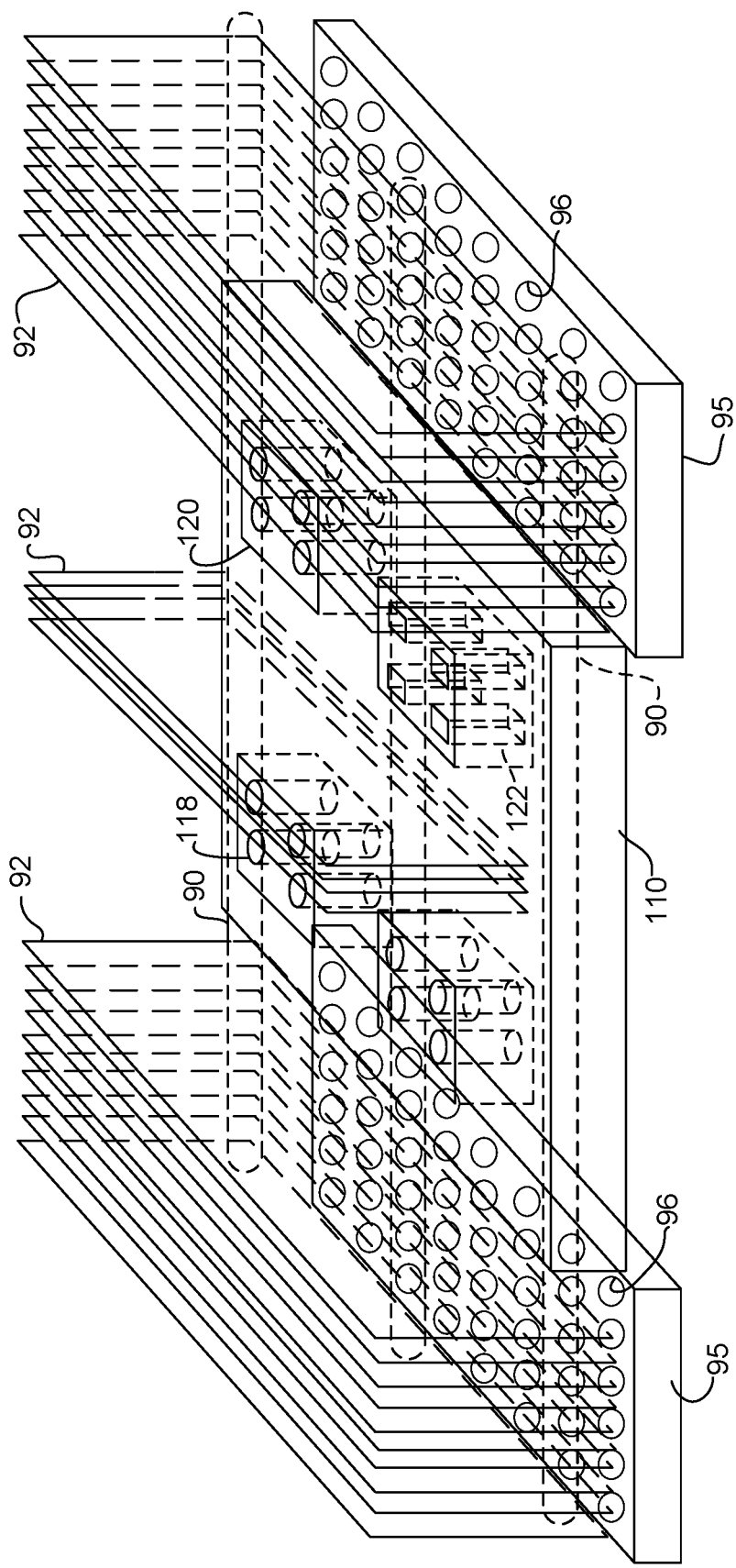
FIG. 10 is a perspective of an upper heat dissipation system with electrical and optical paths shown in the thermal transfer plate.

FIG. 10 is a perspective of the upper heat dissipation system comprising the thermal transfer plate 110, heat transfer elements (tubes) 90, MEMS modules 95, and heat-sink fins 92, in accordance with one embodiment. In this example fins 92 are shown positioned along a central portion of the thermal transfer plate 110, between the electrical and optical paths 118, 122 Electrical and optical paths 118, 122 (power block 120, optical block 129) are shown passing through the thermal transfer plate 110 for transferring power and optical signals from an upper surface of the thermal transfer plate to a lower surface of the thermal transfer plate positioned adjacent to the substrate and die package.

As previously described, the MEMS modules 95 force (push) air out air exhaust 96, upwards over the fins 92 coupled to the thermal transfer plate 110 (e.g., through heat transfer elements 90). In one or more embodiments, the fins 92 are coupled to the multi-phase heat transfer system (e.g., vapor chamber in thermal transfer plate, heat pipes, or any combination thereof).

Figure 11:
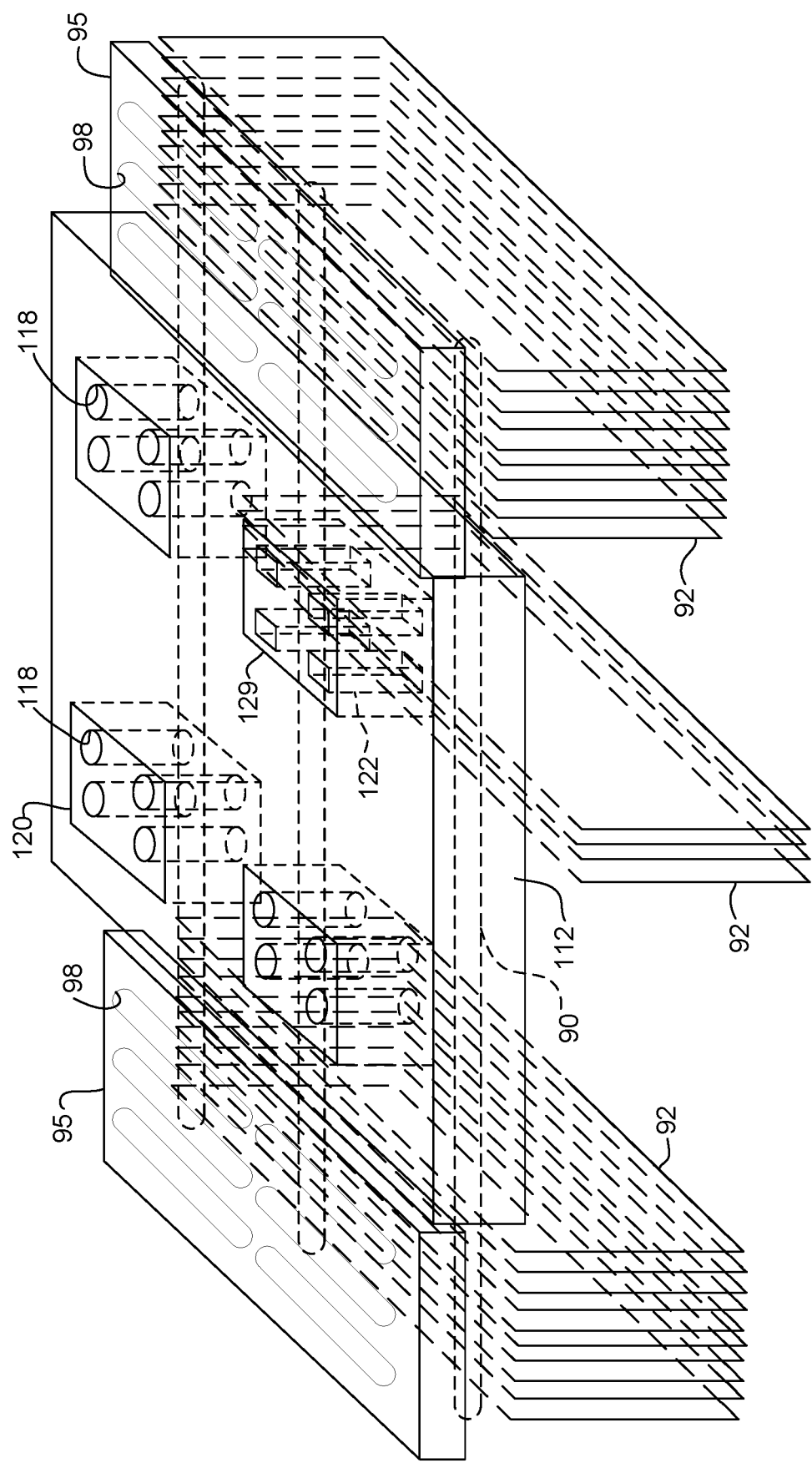
FIG. 11 is a perspective of a lower heat dissipation system with the electrical and optical paths shown in the thermal transfer plate.

FIG. 11 shows the lower heat dissipation system comprising the thermal transfer plate 112, heat transfer tubes 90, and the MEMS modules 95. Electrical and optical paths 118, 122 (power block 120 and optical block 129) are shown passing through the thermal transfer plate from a lower surface of the thermal transfer plate to an upper surface positioned adjacent to the substrate and die package. As previously described, the MEMS modules 95 push air downwards over the fins 92 coupled to the thermal transfer plate. The air inlet (inlet ports) 98 are shown in FIG. 11.

It is to be understood that the number and arrangement of electrical paths 118 and optical paths 122 within the thermal transfer plate 110, 112 is only an example and changes may be made without departing from the scope of the embodiments. For example, each power block 120 may comprise only two electrical paths with the power blocks positioned side by side to provide space for additional heat transfer elements 90.

Figure 12:
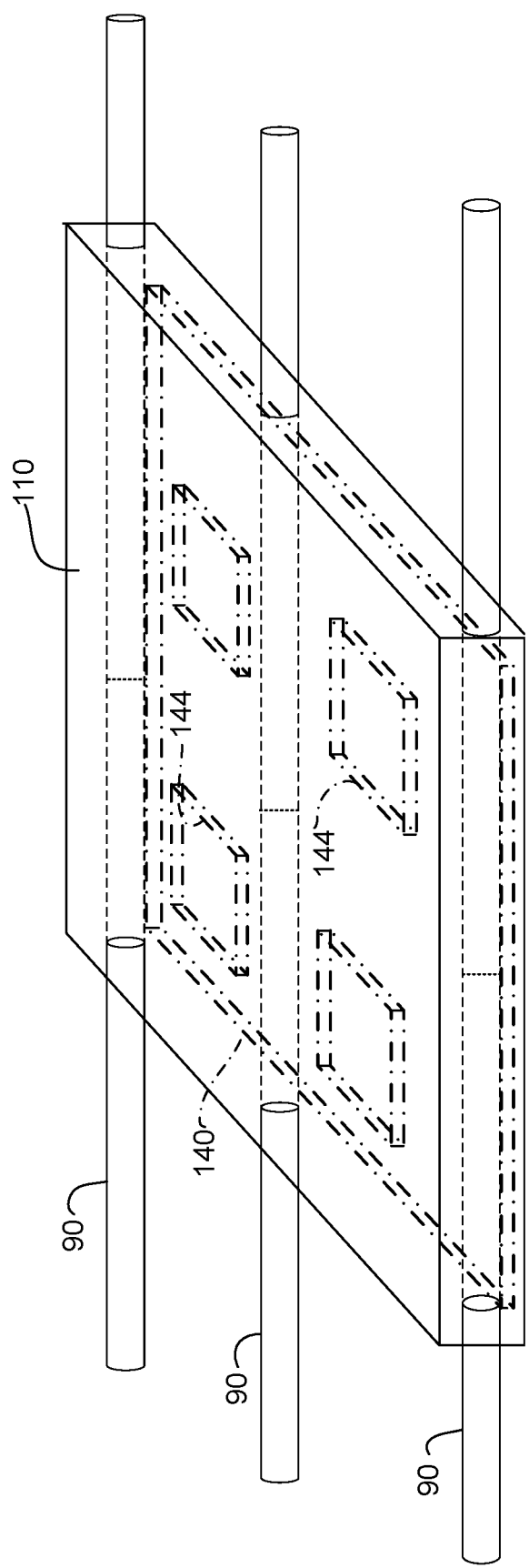
FIG. 12 is a perspective of the thermal transfer plate with the vapor chamber and heat transfer tubes, in accordance with one embodiment.

FIG. 12 is a perspective illustrating an example of a vapor chamber 140 positioned within the thermal transfer plate 110, in accordance with one embodiment. The vapor chamber 140 includes sealed openings 144 for receiving the electrical and optical paths, as previously described. In one example, the heat transfer elements 90 each comprise a graphene enhanced copper tube that extends through the thermal transfer plate 110. The tubes 90 may be positioned, for example, above the vapor chamber 140, as shown in FIG. 12. In another example, the heat transfer elements 90 comprise heat pipes. Each tube 90 may comprise two individually sealed chambers for transferring heat outward away from the thermal transfer plate 110. As previously noted, the vapor chamber may also comprise a plurality of individually sealed vapor chambers positioned around the openings 144 in the thermal transfer plate 110. The vapor chamber and heat pipes are routed and positioned around the power delivery block and optical path openings. It is to be understood that the term "vapor chamber" as used herein may refer to any type of multi-phase cooling system including one or more vapor chambers, heat pipes, or any combination thereof It is to be understood that the components and arrangements shown in FIGS. 7-12 are only examples and changes may be made without departing from the scope of the embodiments. For example, the substrate and die package may include any number of electrical or optical components in any arrangement and any number of POL modules, optical connectors, electrical connectors, or optical/electrical connectors may be used for transferring power, optical signals, or power and optical signals through the cold plates. Also, the heat dissipation system may comprise any combination or arrangement of the MEMS modules, heat transfer elements, multi-phase heat transfer system, and heatsink fins. It may also be noted that any number of MEMS modules may be used with any number of vapor chamber assemblies. The thermal transfer plate may be positioned on both sides of the substrate and die package or only one side.

Although the apparatus and method have been described in accordance with the embodiments shown, one of ordinary skill in the art will readily recognize that there could be variations made to the embodiments without departing from the scope of the embodiments. Accordingly, it is intended that all matter contained in the above description and shown in the accompanying drawings shall be interpreted as illustrative and not in a limiting sense.

What is claimed is:

1. An apparatus comprising:
    a substrate and die package;
    a thermal transfer plate positioned adjacent to the substrate and die package for cooling the substrate and die package, wherein at least one electrical path extends through a first surface of the thermal transfer plate to a second surface of the thermal transfer plate for transmitting power from a power module to the substrate and die package, and wherein at least one optical path extends through the substrate and die package, and extends from the first surface of the thermal transfer plate to the second surface of the thermal transfer plate; and
    a microelectromechanical system (MEMS) module comprising a plurality of air movement cells for dissipating heat from the thermal transfer plate.

2. The apparatus of claim 1 wherein the thermal transfer plate comprises a multi-phase heat transfer system.

3. The apparatus of claim 2 wherein the multi-phase heat transfer system comprises a vapor chamber.

4. The apparatus of claim 2 wherein the multi-phase heat transfer system comprises a heat pipe.

5. The apparatus of claim 1 further comprising a heat transfer element extending from at least one side of the thermal transfer plate and positioned adjacent to an air outlet of the MEMS module.

6. The apparatus of claim 5 wherein the heat transfer element comprises graphene enhanced copper.

7. The apparatus of claim 5 wherein the heat transfer element comprises a heat pipe.

8. The apparatus of claim 5 wherein the heat transfer element comprises a plurality of tubes extending from opposite sides of the thermal transfer plate.

9. The apparatus of claim 5 further comprising a plurality of fins, wherein the heat transfer element is interposed between the plurality of fins and the MEMS module.

10. The apparatus of claim 1 further comprising a power unit operable to control said plurality of air movement cells and comprising a pulse width modulation power controller.

11. The apparatus of claim 1 further comprising a second electrical path extending through the thermal transfer plate for transmitting an electrical signal to the substrate and die package.

12. The apparatus of claim 1 wherein the at least one electrical path comprises a power via formed in a power delivery block.

13. The apparatus of claim 1 further comprising an optical engine on the substrate and die package that transmits an optical signal through the at least one optical path.

14. The apparatus of claim 13 wherein the at least one optical path comprises a waveguide for transmitting light through the thermal transfer plate and to or from the optical engine.

15. The apparatus of claim 1 wherein at least one electrical connector and at least one optical connector are mounted on one side of the thermal transfer plate and the thermal transfer plate comprises a plurality of electrical paths and optical paths for transmitting power from the at least electrical connector and optical signals from the at least optical connector to the substrate and die package, wherein the substrate and die package comprises at least electronic integrated circuit and at least one photonic integrated circuit.

16. The apparatus of claim 1 further comprising a second thermal transfer plate, the substrate and die package interposed between the thermal transfer plates.

17. The apparatus of claim 16 wherein each of the thermal transfer plates comprises at least one electrical path and at least one optical path for transmitting power and an optical signal through the thermal transfer plate.

18. An apparatus comprising:
a substrate and die package comprising at least one electronic integrated circuit and at least one photonic integrated circuit; and
a heat dissipation system for dissipating heat from the substrate and die package comprising:
a vapor chamber;
heat sink fins coupled to the vapor chamber; and
a microelectromechanical system (MEMS) module comprising a plurality of air movement cells operable to push air over the heat sink fins;
wherein the heat dissipation system comprises at least one electrical path for transmitting power or an electrical signal to the at least one electronic integrated circuit and at least one optical path for transmitting an optical signal to the at least one photonic integrated circuit, wherein the at least one electrical path extends through a first surface of the heat dissipation system to a second surface of the heat dissipation system, and wherein the at least one optical path extends through the substrate and die package, and extends from the first surface the heat dissipation system to the second surface of the heat dissipation system.

19. The apparatus of claim 18 wherein the vapor chamber comprises a vapor chamber positioned in a thermal transfer plate and a heat pipe.

20. The apparatus of claim 18 wherein the vapor chamber comprises a vapor chamber positioned in a thermal transfer plate and at least one heat transfer element coupled to the vapor chamber, wherein the heat sink fins are coupled to the at least one heat transfer element.

21. The apparatus of claim 18 further comprising a second heat dissipation system, wherein the substrate and die package is interposed between the heat dissipation systems.

22. The apparatus of claim 21 wherein said second heat dissipation system comprises a second electrical path for transmitting power or an electrical signal to the at least one electronic integrated circuit and a second optical path for transmitting an optical signal to the at least one photonic integrated circuit.

23. The apparatus of claim 18 wherein the heat dissipation system is configured for receiving cooling airflow from a fan.

24. An apparatus comprising:
a thermal transfer plate configured for dissipating heat from an electronic component or a photonic component associated with a substrate and die package;
a heat transfer element coupled to the thermal transfer plate; and
a microelectromechanical system (MEMS) module comprising a plurality of air movement cells operable to push air over the heat transfer element;
wherein the thermal transfer plate comprises at least one path for transmitting power to the electronic component, and at least one path for an optical signal to the photonic component, wherein the at least one path for transmitting power extends through a first surface of the thermal transfer plate to a second surface of the thermal transfer plate, and wherein the at least one path for the optical signal extends through the substrate and die package, and extends from the first surface of the thermal transfer plate to the second surface of the thermal transfer plate.

25. The apparatus of claim 24 wherein the heat transfer element comprises a heat pipe.

26. The apparatus of claim 24 wherein the heat transfer element comprises a graphene enhanced copper tube.

27. The apparatus of claim 24 further comprising fins coupled to the heat transfer element.

28. The apparatus of claim 24 wherein the thermal transfer plate is configured for dissipating heat from in-package optics comprising the electronic component and the photonic component.

* * * * *